US012638515B2

(12) United States Patent
Ler et al.

(10) Patent No.: US 12,638,515 B2
(45) Date of Patent: May 26, 2026

(54) METHOD FOR DETERMINING AN AGING CONDITION OF A BATTERY CELL IN A HEARING INSTRUMENT

(71) Applicant: Sivantos Pte. Ltd., Singapore (SG)

(72) Inventors: Gee Heng Ler, Singapore (SG); Heng Goh Yap, Singapore (SG); Boon Siang Tan, Singapore (SG); Chuan En Andrew Ong, Singapore (SG); Guan Hong Ng, Singapore (SG)

(73) Assignee: Sivantos Pte. Ltd., Singapore (SG)

( * ) Notice: Subject to any disclaimer, the term of this patent is extended or adjusted under 35 U.S.C. 154(b) by 200 days.

(21) Appl. No.: 18/667,383

(22) Filed: May 17, 2024

(65) Prior Publication Data

US 2024/0393404 A1 Nov. 28, 2024

(30) Foreign Application Priority Data

May 24, 2023 (DE) ..................... 10 2023 204 852.3

(51) Int. Cl.
| | |
|---|---|
| *G01R 31/392* | (2019.01) |
| *G01R 31/3835* | (2019.01) |
| *G01R 31/396* | (2019.01) |
| *H02J 7/00* | (2026.01) |
| *H04R 1/10* | (2026.01) |
| *H04R 1/1025* | (2026.01) |
| *H04R 29/00* | (2006.01) |

(52) U.S. Cl.
CPC ....... *G01R 31/392* (2019.01); *G01R 31/3835* (2019.01); *G01R 31/396* (2019.01); *H04R 1/1025* (2013.01); *H04R 29/001* (2013.01); *H02J 7/005* (2020.01)

(58) Field of Classification Search
None
See application file for complete search history.

(56) References Cited

U.S. PATENT DOCUMENTS

| | | | |
|---|---|---|---|
| 2015/0061602 A1* | 3/2015 | Lohmann .......... | H01M 10/4257 |
| | | | 324/426 |
| 2022/0225005 A1 | 7/2022 | Christensen et al. | |
| 2023/0010213 A1 | 1/2023 | Roth | |

FOREIGN PATENT DOCUMENTS

| | | |
|---|---|---|
| DE | 102012010487 A1 | 11/2013 |
| EP | 2846395 A2 | 3/2015 |

* cited by examiner

*Primary Examiner* — Farhana A Hoque
(74) *Attorney, Agent, or Firm* — Laurence A. Greenberg; Werner H. Stemer; Ralph E. Locher

(57) ABSTRACT

A state of health of a battery cell used in a hearing instrument is ascertained. For each of a plurality of charging cycles, a battery manager of the hearing instrument ascertains a charge transferred to the battery cell and a number of charging characteristic values that provides information about the change in a state of charge of the battery cell brought about by the charge. Based on the transferred charge and the charging characteristic values a capacity characteristic value is ascertained that forms a characteristic variable for a present charging capability of the battery cell. A signal processor averages respective capacity characteristic values of at least some past charging cycles at a specific time and calculates an averaged charging capacity. The averaged charging capacity is compared with a reference value representing an original capacity of the battery cell to determine the state of health of the battery cell.

16 Claims, 4 Drawing Sheets

METHOD FOR DETERMINING AN AGING CONDITION OF A BATTERY CELL IN A HEARING INSTRUMENT

FIELD AND BACKGROUND OF THE INVENTION

The invention relates to a method for ascertaining a state of health of a battery cell that is used in a hearing instrument.

Hearing instruments are increasingly being used with rechargeable battery cells. The capacity of the battery cell is known to decrease as the number of charging cycles increases, that is to say that the battery cell is able to store ever less charge and is therefore also able to provide less charge (and therefore electric power for operation), as a result of which the hearing instrument's maximum operating time before a fresh charging process is required decreases. This is also referred to as the battery's "aging".

If the hearing instrument is headphones that are used primarily for entertainment purposes, it may still appear acceptable to a user to prematurely interrupt operation until the next charging process is possible. If, however, the hearing instrument is used to take care of a hearing impairment of the user, that is to say in the case of a hearing device (or headphones with additional hearing device functions adaptable on a user-specific basis), a sudden deterioration in battery power may even be associated with considerable hazards, for instance on a road, if the absence of hearing support from the hearing instrument means that approaching motor vehicles can no longer be detected in good time.

Adequate battery capacity is thus necessary for safe operation, to which end a battery that has aged too greatly should be replaced in the event of doubt. A user will also want to avoid replacing a battery that still has adequate functionality, however, in order to avoid unnecessary costs.

SUMMARY OF THE INVENTION

It is therefore the object of the invention to provide a way of determining a state of health of a battery cell for a hearing instrument as precisely as possible.

The cited object is achieved according to the invention by a method for ascertaining a state of health of a battery cell in a hearing instrument, or that is used in a hearing instrument, wherein, for each of a plurality of charging cycles, a battery manager of the hearing instrument ascertains a charge transferred to the battery cell, the battery manager ascertains a number of charging characteristic values that provides information about the change in a state of charge of the battery cell brought about by said charge, and the transferred charge and said number of charging characteristic values are taken as a basis for ascertaining a capacity characteristic value that forms a characteristic variable for a present charging capability of the battery cell.

According to the method, there is provision in this case for a signal processor of the hearing instrument or a signal processor of an assistive device associated with the hearing instrument to average the respective capacity characteristic values of at least some of the past ten charging cycles at a specific time, and for an averaged charging capacity to be calculated therefrom, and additionally for the averaged charging capacity to be compared with a reference value that forms a characteristic variable for an original capacity of the battery cell, and for the state of health of the battery cell to be determined therefrom. Refinements that are advantageous and in part inventive in themselves are the subject of the subclaims and the description that follows.

A hearing instrument in this case encompasses generally any mobile, portable apparatus that is configured to generate a sound signal from an electrical signal—which may also be constituted by an internal signal of the apparatus—and to supply said sound signal to the hearing of a wearer of this apparatus, that is to say in particular headphones (e.g. in the form of an "earplug"), a headset, smartglasses with a loudspeaker, etc. A hearing instrument also encompasses a hearing device in the narrower sense, however, that is to say a device for taking care of a hearing impairment of the wearer, in which an input signal generated from an ambient signal by means of a microphone is processed to produce an output signal and amplified, in particular on the basis of frequency band, in the process, and an output sound signal generated from the output signal by means of a loudspeaker or the like is suitable for compensating for at least some of the hearing impairment of the wearer, in particular in a user-specific manner.

A battery cell in this case encompasses in particular any rechargeable power source of the hearing instrument that is intended and configured to provide the operating power for the hearing instrument during normal operation. Preferably, the battery cell in this case is intended and physically designed for replacement. In particular, the battery cell is the smallest individually replaceable unit of a power source of the hearing instrument as defined above.

A state of health of the battery cell in this case is intended to be understood to mean in particular a decrease in the maximum capacity attainable in a charging cycle, which is normally associated with an increasing number of charging cycles of the battery cell. This means in particular that repeatedly charging the battery cell results in the maximum capacity and hence also the maximum charge that can be provided by the battery cell during operation of the hearing instrument after the charging process becoming steadily lower. The state of health may be in particular a quantitative characteristic value for this decrease that expresses the still-available maximum capacity attainable in a charging cycle as a ratio with a corresponding reference value and/or opening value that characterizes the capacity when the battery cell is delivered and/or put into operation.

A charging cycle of the battery cell encompasses in particular charging for a predefined minimum period and/or with a predefined minimum charge, which in this case needs to be transferred to the battery cell. That is to say that if a charging process in this context is terminated prematurely (i.e. before the minimum period or the minimum charge is attained) (e.g. because the user needs to use the hearing instrument unexpectedly), this can be disregarded in particular as a charging cycle.

The hearing instrument in this case encompasses a battery manager, which can be regarded, in particular according to the definition, as any apparatus that controls the transfer of the electrical power and charge to the battery cell during the charging process, and moreover preferably also controls the delivery of the battery power from the battery cell for the functions of normal operation during same.

In a plurality of charging cycles, the battery manager now firstly ascertains a charge transferred to the battery cell and secondly ascertains what change this charge brings about in the state of charge of the battery cell in each case, for which purpose a number of charging characteristic values is ascertained. This number of charging characteristic values provides information about said change in the state of charge that is brought about by the transferred charge, the change brought about being expressed in particular in relation to an instantaneous maximum capacity by the respective charging characteristic value(s), i.e. providing a reference to the respectively available maximum charge that the battery cell is currently able to take on (and accordingly then provide again) during the relevant charging cycle. The number of charging characteristic values may be constituted in particular by a percentage change in the maximum available capacity of the battery cell at present, or may permit direct computation (or ascertainment on the basis of a table) thereof.

The charge transferred to the battery cell during the charging cycle and the number of charging characteristic values that characterize the change in the state of charge brought about by the transferred charge in each case are now taken as a basis for ascertaining a capacity characteristic value. The capacity characteristic value preferably expresses the charge in relation to the change in the state of charge brought about thereby, so as to calculate a characteristic variable for the present charging capability of the battery cell by performing in particular a normalization over the charge.

By way of example, a, in particular percentage, change in the state of charge of the battery cell (preferably with reference to the prevailing maximum capacity) is ascertained as the number of charging characteristic values, or on the basis thereof, for a charging cycle, and said change and the transferred charge are taken as a basis for ascertaining the capacity characteristic value. In particular, this can be accomplished by normalizing the change in the state of charge over the charge transferred in the charging cycle (for example by way of simple division) in order to obtain the capacity characteristic value of the charging cycle. Normalization over the charge allows the present charging capability, that is to say in particular the present maximum capacity, of the battery cell to be inferred.

A signal processor, which may be arranged in the hearing instrument or in an assistive device associated with and in particular wirelessly connected to the hearing instrument, now averages at least some, preferably at least five and particularly preferably at least half, of the capacity characteristic values for the past ten, preferably for the past thirty, charging cycles, preferably at least two of the most recent five and particularly preferably at least two of the most recent four capacity characteristic values being included in the mean value.

This mean value is used (in the signal processor) to calculate an averaged charging capacity, which is compared with a reference value for the original capacity of the battery cell (and thus for the maximum providable charge when the battery cell is delivered and/or put into operation), the reference value being able to be constituted in particular by an appropriate manufacturer specification for the capacity of the battery cell.

The signal processor in this case may be constituted in particular by that processor (e.g. CPU) of the hearing instrument or of the assistive device that is intended and configured to provide the computing power, during the intended operation of the hearing instrument or of the assistive device, for the respective signal processing, and/or other main functions, thereof.

Each of the capacity characteristic values provides information about the present charging capability for the associated charging cycle at the time of the charging cycle. Averaging the capacity characteristic values for the immediately past charging cycles firstly allows errors that can arise e.g. when calculating the capacity characteristic values by discretely tabulating the charging characteristic values to be reduced. Secondly, extrapolation of the change in the state of charge brought about by a charge to the present charging capability, that is to say in particular the complete present capacity, especially for incomplete or prematurely terminated charging, may be prone to error, and so here too the averaging reduces the relative influence of such errors. Last but not least, outliers of the capacity characteristic value that may have a slightly different value due to unusual external conditions (e.g. temperature or humidity) carry less weight.

All in all, the method described allows the state of health of the battery cell to be precisely ascertained without additional devices, if necessary with the exception of an assistive device that is provided anyway for joint operation together with the hearing instrument.

Expediently, a starting value, available at the beginning of the relevant charging cycle, of a battery voltage of the battery cell and a final value, available at the end of the relevant charging cycle, of the battery voltage are recorded as the number of charging characteristic values for the respective charging cycle. The battery voltage can then be taken as a basis for ascertaining the respective state of charge, in particular with reference to the present maximum capacity, on the basis of an applicable function or from a table, with the result that the starting value of the battery voltage can be taken as a basis for ascertaining an opening state of charge of the battery cell and the final value of the battery voltage can be taken as a basis for ascertaining a closing state of charge of the battery cell, which are able to be used to ascertain the change in the state of charge of the battery cell brought about by the transferred charge during the relevant charging cycle. Preferably, the opening state of charge and the closing state of charge are ascertained from the starting value and the final value of the battery voltage, respectively, by means of a lookup table.

In an alternative refinement, a plurality of instantaneous values of the battery voltages of the battery cell are recorded at previously stipulated times as the number of charging characteristic values for the respective charging cycle. This may be advantageous in that a greater number of data points relating to the charging characteristic values is available for the charging cycle. The instantaneous values of the battery voltages can then be taken as a basis for ascertaining a plurality of corresponding instantaneous states of charge of the battery cell for the previously stipulated times, which can in turn be taken as a basis for ascertaining the change in the state of charge of the battery cell brought about by the transferred charge during the relevant charging cycle.

An open-circuit voltage and/or a voltage of a charging circuit and/or a voltage of a discharging circuit are preferably recorded as the battery voltage in this case. These voltages provide, in particular compared with a corresponding reference voltage, particularly precise information about a present state of charge of the battery.

The respective capacity characteristic values are preferably averaged using a weighted and/or recursive mean value. The applicable weights or recursion parameters can be chosen such that the values of the most recent charging cycles in each case are included in the averaged charging capacity most heavily. In particular, the weights therefor can also be chosen depending on intervals of time between the charging cycles and/or depending on a charging duration of the respective charging cycle and/or a charge transferred in the process.

Advantageously, an initial value for said capacity characteristic value, which is ascertained in one of the first ten charging cycles, preferably in one of the first five charging cycles, after the battery cell in the hearing instrument is put into operation, or a manufacturer specification of the original capacity, is used as said reference value. The former variant has the advantage that determination of the state of health is less dependent on the manufacturer specifications. The latter specification permits a more streamlined process.

It is found to be additionally advantageous if a use criterion for a charging cycle is checked, and the capacity characteristic value of the relevant charging cycle is additionally calculated depending on the meeting of the use criterion, and is thus used in said dependency to calculate the averaged charging capability. If the use criterion is not met, then in particular the capacity characteristic value of the relevant charging cycle is ignored when calculating the averaged charging capacity.

A charging duration of the charging cycle and/or the charge transferred during the charging cycle and/or the final value of the battery voltage and/or the closing state of charge of the battery cell is preferably checked as the use criterion in this case. It is thus possible to ensure that in particular excessively short or prematurely terminated charging cycles and/or charging cycles in which adequate charge has not been transferred are not used, with the result that it is possible to avoid errors due to tabulated charging characteristic values that are excessively close together or the like.

Conveniently, a capacity characteristic value is disregarded for the averaged charging capacity during an averaging if its variance from the mean value exceeds a predefined limit value. This permits statistical outliers or any values too greatly influenced by adverse ambient conditions (such as temperature) to be ignored.

It is found to be additionally advantageous if the averaged charging capacity is calculated by storing said plurality of capacity characteristic values in a first-in-first-out memory (FIFO memory) that is addressable by the signal processor of the hearing instrument, or by the signal processor of the assistive device associated with the hearing instrument, and/or the storage capacity of which corresponds exactly to said plurality of capacity characteristic values. The FIFO memory makes it possible to ensure that firstly no more memory than necessary for the method is allocated, and secondly obsolete values are reliably disregarded and therefore data errors due to erroneous allocations are avoided.

The invention additionally mentions a hearing system, which encompasses a hearing instrument having a battery cell and a battery manager, and a signal processor, the hearing system being configured to carry out the method described above.

The hearing system according to the invention shares the advantages of the method according to the invention. The advantages indicated for the method and for its developments can be transferred, mutatis mutandis, to the hearing instrument.

In particular, the signal processor in this case may be arranged in the hearing instrument, and can form part of the processor architecture therein. In this case, the hearing system may also be constituted solely by the hearing instrument.

In an alternative refinement, the hearing system encompasses an assistive device that is associated with the hearing instrument and comprises said signal processor. The assistive device may preferably be constituted by a smartphone or a smartwatch. At least some of the computation steps required for the method can then be carried out on the assistive device. In the mentioned case of a smartphone or smartwatch, the state of health can be displayed on the screen in each case.

BRIEF DESCRIPTION OF THE FIGURES

An exemplary embodiment of the invention is explained in more detail below with reference to drawings, in each of which, schematically.

Mutually corresponding parts and variables are each provided with the same reference signs throughout the figures.

DETAILED DESCRIPTION OF THE INVENTION

Figure 1:
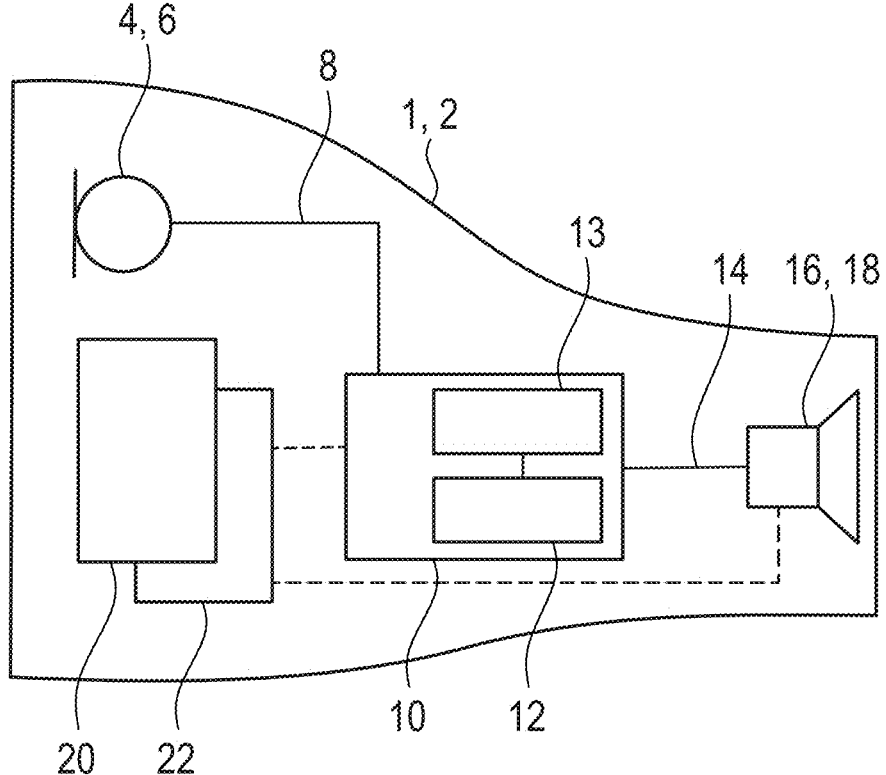
FIG. 1 shows a block diagram of a hearing instrument having a rechargeable battery cell.

FIG. 1 schematically shows a block diagram of a hearing instrument 1, which in the present case is in the form of a hearing device 2 for taking care of a hearing impairment of a user. The hearing device 2 encompasses a first electroacoustic input transducer 4, which in the present case is in the form of a microphone 6 and is configured to generate an electrical input signal 8 from ambient sound, not shown in more detail, during operation of the hearing device 2, oscillations of the air pressure due to the sound waves in the ambient sound being translated into corresponding oscillations of a voltage and/or current of the input signal 8. The hearing device 2 additionally comprises a signal processing unit 10 having a signal processor 12, said signal processing unit being configured to process the input signal 8 in a user-specific manner during operation of the hearing device 2, and to amplify and/or compress said input signal on a frequency-band-by-frequency-band basis in particular according to the audiological requirements of the user. The signal processing unit 10 may comprise in particular task-specific circuits such as ASICs for this purpose, more general processes of signal processing being carried out in the signal processor 12, which, to this end, also addresses a memory 13 of the signal processing unit 10.

The signal processing described for the input signal 8 generates an output signal 14, which is supplied to an electroacoustic output transducer 16 of the hearing device 2. The output transducer 16, which in the present case is constituted by a loudspeaker 18 (but may also be formed by a bone conduction receiver or the like), uses the output signal 14 during operation of the hearing device 2 to generate an output sound signal, not shown in more detail, which is supplied to the hearing (likewise not shown) of the user.

The hearing instrument 1 in the form of a hearing device 2 additionally comprises a rechargeable battery cell 20 that is configured and intended to provide the necessary electrical power during operation of the hearing device 2 and thus to supply power (dashed lines) to the electrical components, that is to say in particular the signal processing unit 10 and the output transducer 16. For said supply of power via the battery cell 20, the hearing device 2 additionally comprises a battery manager 22, which is electrically connected to the battery cell 20 and is configured to draw a respective required electrical power from the battery cell 20 and to supply said power to the respective load. Additionally, the battery manager 22 is also configured to control the flow of power to the battery cell 20 during a charging process on the battery cell 20, e.g. in order to prevent power peaks or the like that are a potential risk to the integrity of the battery cell 20.

Repeatedly charging the battery cell 20 gradually impairs the maximum capacity thereof, that is to say in particular the maximum charge that can be provided for the electrical loads of the hearing device 2 by the battery cell 20 after a charging cycle before a fresh charging process is required. This can lead to the user, with a charging cycle that was adequate for example for trouble-free operation over one day when the hearing device 2 was put into operation, no longer being able to use and operate the hearing device 2 as originally customary from a more certain degree of aging of the battery cell 20 onward, that is to say also from the drop in its maximum capacity during charging processes onward. In particular, functions that require computationally intensive algorithms for signal processing could suddenly fail during operation of the hearing device 2, or the hearing device 2 could stop operating completely. Especially on roads where hearing approaching (motor) vehicles in good time is also important for safety, however, this could become a problem that needs to be taken seriously.

In a manner that is yet to be described, the user is now provided with a way of precisely identifying advanced aging of the battery cell 20 in order to be able to replace the battery cell if necessary, without such a change needing to be made "just to be on the safe side" and thus possibly far too early.

Figure 2:
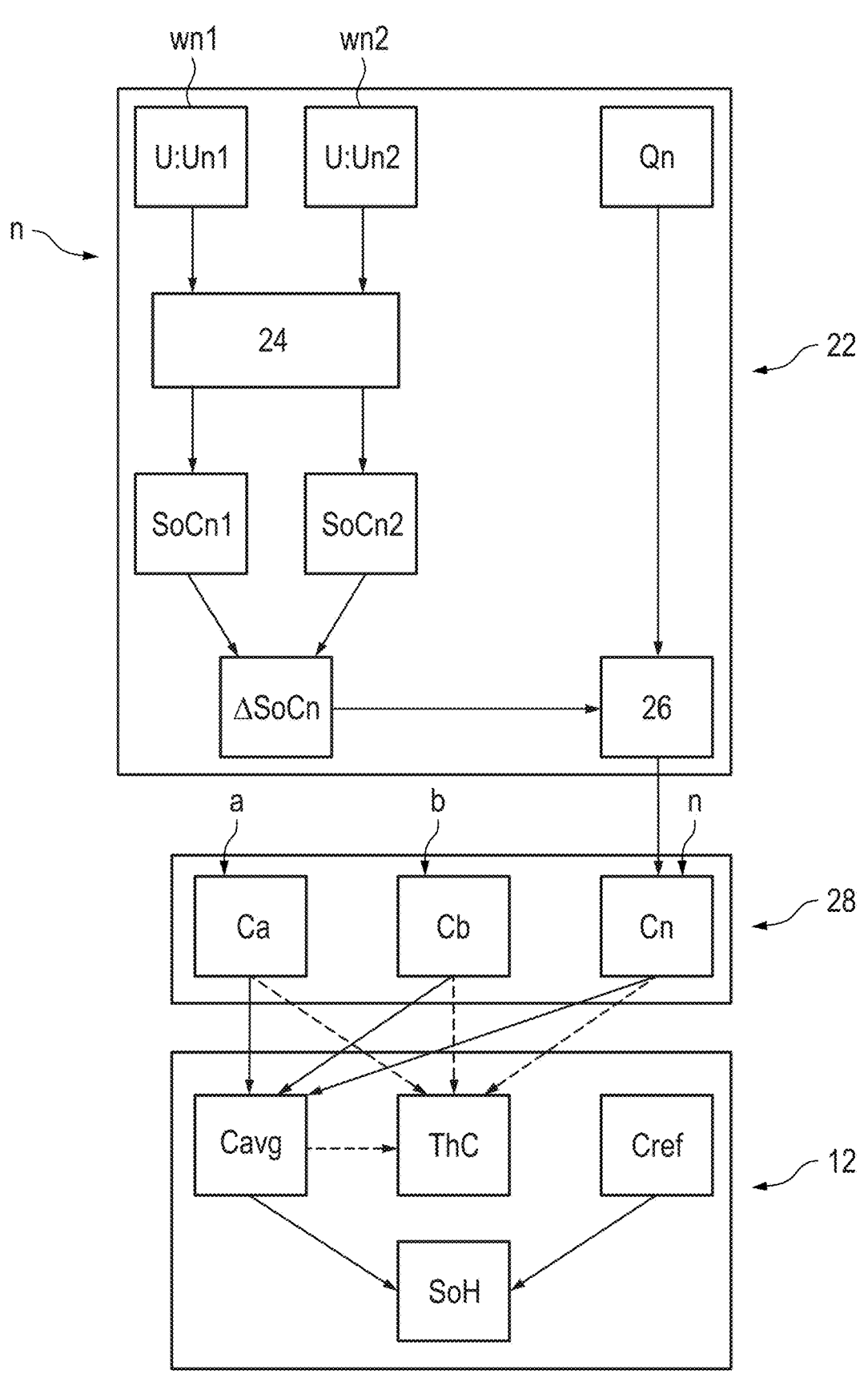
FIG. 2 shows a block diagram of a method for determining a state of health of the battery cell shown in FIG. 1.

FIG. 2 shows a block diagram of a method that can be used to ascertain a state of health of the battery cell 20 for the hearing device 2. For an arbitrary charging cycle n, the battery manager 22 ascertains a charge Qn that is transferred to the battery cell during the charging cycle n. Additionally, the battery manager 22 first determines a starting value Un1 and a final value Un2 of a battery voltage U of the battery cell 20 in FIG. 1 as charging characteristic values wn1, wn2 for the charging cycle n. The battery voltage U may be in particular an open-circuit voltage. The starting value Un1 and the final value Un2 of the battery voltage U can be used to ascertain, by means of a lookup table 24, an opening state of charge SoCn1 and a closing state of charge SoCn2, respectively, which thus indicate the charge or state of charge (e.g. as a percentage, for instance with reference to the respective present maximum) at which the charging cycle n was initiated, and the charge or state of charge at which the charging cycle n was terminated. This can be used to ascertain a change in the state of charge ΔSoCn that was brought about by the charge Qn transferred to the battery cell 20 in the charging cycle n.

The change in the state of charge ΔSoCn and/or the charge Qn transferred to the battery cell 20 in the charging cycle n are now subjected to a use criterion 26. The use criterion 26 may contain e.g. a threshold value comparison of the charge Qn and/or the change in the state of charge ΔSoCn and/or a charging duration with an appropriate minimum value. If the transferred charge Qn, the change in the state of charge ΔSoCn or the charging period is too low, the data relating to the charging cycle n are not considered further. If the use criterion 26 is met, that is to say that the transferred charge Qn, the change in the state of charge ΔSoCn or the charging period is sufficiently high, or sufficiently long in the case of the duration, then the change in the state of charge ΔSoCn and the transferred charge Qn are used to calculate a capacity characteristic value Cn by way of division.

As a result of the change in the state of charge ΔSoCn that is brought about by the charge Qn in the charging cycle n being normalized over this very charge Qn, the capacity characteristic value Cn provides information about the maximum capacity at the time at which the charging cycle n occurred. This capacity characteristic value Cn for the charging cycle n is now stored in a FIFO memory 28, which may be physically implemented in particular on the memory 13.

The signal processor 12 now averages the capacity characteristic values Ca, Cb, . . . , Cn of at least the last five, preferably also the last ten, charging cycles a, b, . . . n, the averaging possibly also being able to be performed in weighted fashion (with greater weight on more recent charging cycles) or recursively, and forming an averaged charging capacity Cavg in the process. This may also involve carrying out an inspection to ascertain whether one of the capacity characteristic values Ca, Cb, . . . , Cn possibly forms a statistical outlier, for instance by individually comparing each of the capacity characteristic values Ca, Cb, . . . , Cn used with the averaged charging capacity Cavg and checking whether a variance remains below a predefined limit value ThC (dashed arrows). If this is not the case, the relevant capacity characteristic value can be disregarded, and the averaged charging capacity Cavg can be calculated afresh (that is to say without the contribution of the "outlier" singled out in this way).

The averaged charging capacity Cavg is now compared with a reference value Cref for an original capacity of the battery cell 20, in order to obtain the state of health SoH of the battery cell 20 in this way. The reference value Cref can be derived for instance from a manufacturer specification, or can be ascertained from the charging characteristic values in the first charging cycle after the battery cell is put into operation, in a similar manner to that described above. Preferably, the state of health SoH of the battery cell 20 is ascertained by dividing the averaged charging capacity Cavg by the reference value Cref. As a result, the state of health SoH provides a percentage value of the currently possible capacity (rendered by the averaged charging capacity Cavg) with reference to the original value.

Figure 3:
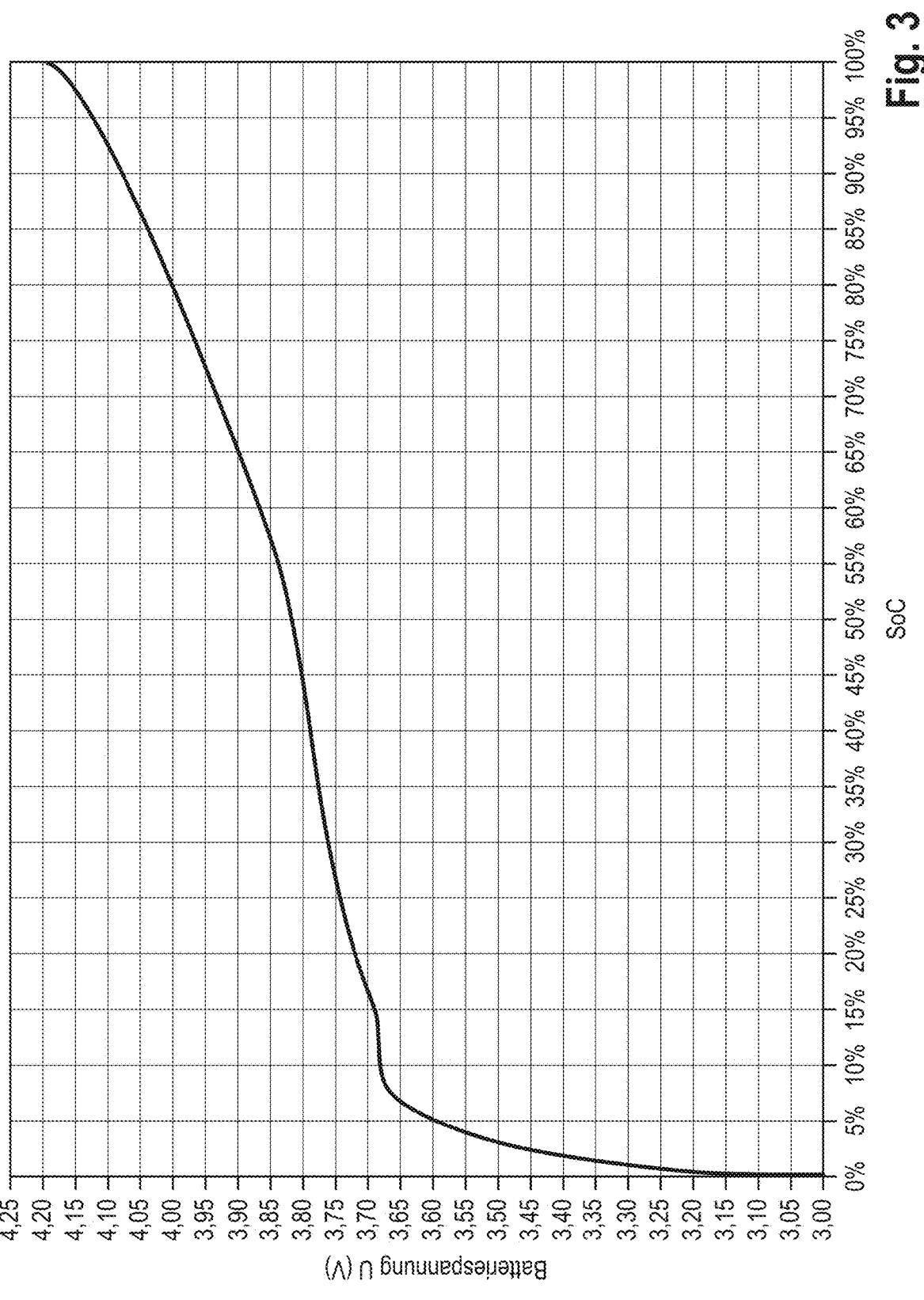
FIG. 3 shows a graph of a relationship between the battery voltage of the battery cell shown in FIG. 1 and the state of charge.

In FIG. 3, a battery voltage U of the battery cell 20 (in volts) shown in FIG. 1 is plotted against the state of charge SoC (in %) in a graph. A clearly nonlinear relationship can be seen, the battery voltage initially rising sharply for very low values of the state of charge SoC, and the rises then becoming much more moderate. Special consideration should be given to this nonlinear response when forming the lookup table 24 for the method shown in FIG. 2, in order to minimize errors due to the discretization required for the lookup table 24 as far as possible.

Figure 4:
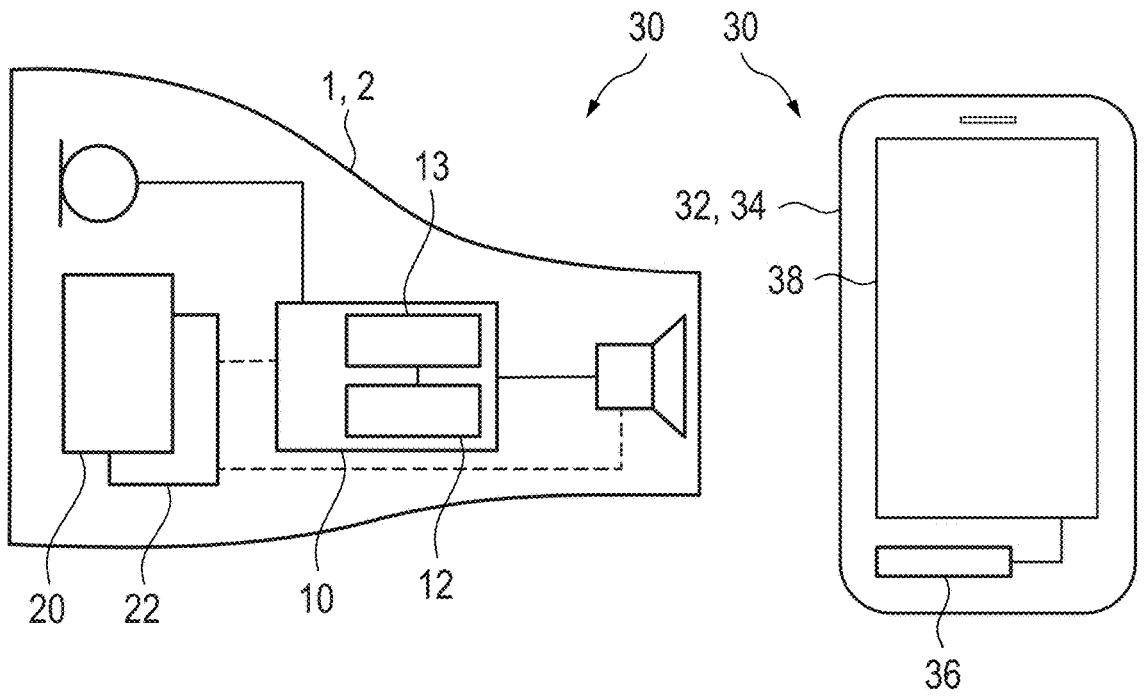
FIG. 4 shows a block diagram of a hearing system having the hearing instrument shown in FIG. 1 and an assistive device.

FIG. 4 shows a hearing system 30 that encompasses the hearing device 2 shown in FIG. 1. Additionally, the hearing system 30 also encompasses an assistive device 34, which is in the form of a smartphone 32 in the present case and the signal processor 36 of which can be used to take the capacity characteristic values Ca, Cb, . . . . Cn as a basis for carrying out at least some of the computations of the method shown in FIG. 2, for which purpose said capacity characteristic values Ca, Cb, . . . . Cn are transferred from the hearing device 2 to the smartphone 32 via a data connection, which is not shown in more detail. Moreover, the state of health SoH of the battery cell 20 of the hearing device 2 can be displayed (regardless of the use of the signal processor 36 for the method shown in FIG. 2) to the user on a screen 38 of the smartphone 32 (for instance in an appropriate app for controlling the hearing device 2).

Although the invention has been illustrated and described more thoroughly in detail by way of the preferred exemplary embodiment, the invention is not restricted by the disclosed examples, and other variations can be derived therefrom by a person skilled in the art without departing from the scope of protection of the invention.

LIST OF REFERENCE SIGNS 1 hearing instrument
2 hearing device
4 input transducer
6 microphone
8 input signal
10 signal processing unit
12 signal processor
13 memory
14 output signal
16 output transducer
18 loudspeaker
20 battery cell
22 battery manager
24 lookup table
26 use criterion
28 FIFO memory
30 hearing system
32 smartphone
34 assistive device
36 signal processor
38 screen
a, b, n charging cycle
Ca, Cb, Cn capacity characteristic value
Cavg averaged charging capacity
Cref reference value (for an original capacity)
Qn charge
SoC state of charge
SoCn1/2 opening/closing state of charge
SoH state of health (of the battery cell)
ThC predefined limit value
U battery voltage
Un1/2 starting/final value (of the battery voltage)
wn1/2 charging characteristic value
ΔSoCn change in the state of charge

The invention claimed is:

1. A method for ascertaining a state of health of a battery cell used in a hearing instrument, the method comprising:

for each of a plurality of charging cycles:

ascertaining by a battery manager of the hearing instrument a transferred charge that is transferred to the battery cell;

ascertaining by the battery manager a number of charging characteristic values that provide information about the change in a state of charge of the battery cell brought about by the transferred charge; and ascertaining, on a basis of the transferred charge and the number of charging characteristic values, a capacity characteristic value that forms a characteristic variable for a present charging capability of the battery cell;

with a signal processor of the hearing instrument or a signal processor of an assistive device associated with the hearing instrument, averaging at a given point in time respective capacity characteristic values of at least some of ten previous charging cycles, and calculating therefrom an averaged charging capacity; and comparing the averaged charging capacity with a reference value that forms a characteristic variable for an original capacity of the battery cell, and determining therefrom the state of health of the battery cell.

2. The method according to claim 1, which comprises, for the respective charging cycle:

taking the number of charging characteristic values as a basis for ascertaining the change in the state of charge of the battery cell that is brought about by the charge transferred to the battery cell; and ascertaining the capacity characteristic value on the basis of the transferred charge and on the basis of the change in the state of charge of the battery cell.

3. The method according to claim 1, which comprises recording the following as the number of charging characteristic values for the respective charging cycle:

a starting value, available at a beginning of the relevant charging cycle, of a battery voltage of the battery cell; and a final value, available at an end of the relevant charging cycle, of the battery voltage.

4. The method according to claim 3, which comprises, for the respective charging cycle:

taking the starting value of the battery voltage as a basis for ascertaining an opening state of charge of the battery cell, and taking the final value of the battery voltage as a basis for ascertaining a closing state of charge of the battery cell; or taking instantaneous values of the battery voltages as a basis for ascertaining a plurality of corresponding instantaneous states of charge of the battery cell for previously stipulated times; and taking the opening state of charge and the closing state of charge, or the instantaneous states of charge, as a basis for ascertaining the change in the state of charge of the battery cell brought about by the transferred charge during the respective charging cycle.

5. The method according to claim 3, which comprises recording as the battery voltage at least one voltage value selected from the group consisting of an open-circuit voltage, a voltage of a charging circuit, and a voltage of a discharging circuit.

6. The method according to claim 4, which comprises ascertaining the opening state of charge and the closing state of charge from the starting value and the final value of the battery voltage, respectively, by reference to a lookup table.

7. The method according to claim 1, which comprises recording a plurality of instantaneous values of the battery voltages of the battery cell at previously stipulated times as the number of charging characteristic values for the respective charging cycle.

8. The method according to claim 1, which comprises averaging the respective capacity characteristic values using at least one of a weighted or recursive mean value.

9. The method according to claim 1, which comprises using as the reference value:

an initial value for the capacity characteristic value, which is ascertained in one of the first ten charging cycles after the battery cell in the hearing instrument is put into operation; or a manufacturer specification of the original capacity.

10. The method according to claim 1, which comprises:

checking a use criterion for a charging cycle; and additionally calculating the capacity characteristic value of the relevant charging cycle depending on meeting of the use criterion.

11. The method according to claim 10, wherein the step of checking the use criterion comprises checking at least one of the following:

a charging duration of the charging cycle;

the charge transferred during the charging cycle;

the final value of the battery voltage;

the closing state of charge of the battery cell.

12. The method according to claim 1, which comprises disregarding a capacity characteristic value in determining the averaged charging capacity during an averaging if a variance thereof from the mean value exceeds a predefined limit value.

13. The method according to claim 1, which comprises calculating the averaged charging capacity by storing the plurality of capacity characteristic values in a first-in-first-out memory that is addressable by the signal processor of the hearing instrument, or by the signal processor of the assistive device associated with the hearing instrument, and/or that has a storage capacity which corresponds exactly to the plurality of capacity characteristic values.

14. A hearing system, comprising:

a hearing instrument having a battery cell and a battery manager; and a signal processor;

configured to carry out the method according to claim 1.

15. The hearing system according to claim 14, which further comprises an assistive device associated with said hearing instrument and containing said signal processor.

16. The hearing system according to claim 15, wherein said assistive device is a smartphone or a smartwatch.

\* \* \* \* \*